United States Patent [19]

Morris

[11] 4,045,247

[45] Aug. 30, 1977

[54] THERMOCOUPLES OF TANTALUM AND RHENIUM ALLOYS FOR MORE STABLE VACUUM-HIGH TEMPERATURE PERFORMANCE

[75] Inventor: James F. Morris, Fairview Park, Ohio

[73] Assignee: The United States of America as represented by the Administrator of the National Aeronautics and Space Administration, Washington, D.C.

[21] Appl. No.: 629,457

[22] Filed: Nov. 6, 1975

[51] Int. Cl.[2] .................. H01L 35/20; G21H 1/10
[52] U.S. Cl. ........................... 136/240; 136/202; 136/236 R
[58] Field of Search ............... 136/240, 236, 202; 73/DIG. 9

[56] References Cited

U.S. PATENT DOCUMENTS

| 1,823,706 | 9/1931 | Staehle | 136/240 |
|---|---|---|---|
| 3,580,744 | 5/1971 | Inouye et al. | 136/234 |
| 3,647,559 | 3/1972 | Truppe et al. | 136/234 |

*Primary Examiner*—Maynard R. Wilbur
*Assistant Examiner*—Richard E. Berger
*Attorney, Agent, or Firm*—N. T. Musial; G. E. Shook; John R. Manning

[57] ABSTRACT

Thermocouples of the present invention provide stability and performance reliability in systems involving high temperatures and vacuums by employing a bimetallic thermocouple sensor wherein each metal of the sensor is selected from a group of metals comprising tantalum and rhenium and alloys containing only those two metals. The tantalum, rhenium thermocouple sensor alloys provide bare metal thermocouple sensors having advantageous vapor pressure compatibilities and performance characteristics. The compatibility and physical characteristics of the thermocouple sensor alloys of the present invention result in improved emf, temperature properties and thermocouple hot junction performance. The thermocouples formed of the tantalum, rhenium alloys exhibit reliability and performance stability in systems involving high temperatures and vacuums and are adaptable to space propulsion and power systems and nuclear environments.

7 Claims, No Drawings

THERMOCOUPLES OF TANTALUM AND RHENIUM ALLOYS FOR MORE STABLE VACUUM-HIGH TEMPERATURE PERFORMANCE

The invention described herein was made by an employee of the United States Government and may be manufactured or used by or for the Government without the payment of any royalties thereon or therefor.

BACKGROUND OF THE INVENTION

1. Field of the Invention

This invention relates to thermocouples and in particular to bimetallic thermocouple sensors composed of metals and alloys having improved reliability and performance characteristics in high-temperature, high-vacuum systems. Thermocouple sensors of the present invention are formed from tantalum, rhenium and alloys thereof to provide a reliable temperature sensing device in high-temperature and vacuum systems. The chemical and physical compatibility of tantalum with rhenium and alloys containing only those two metals provide thermoelectric sensors having reduced thermocouple hot junction failure upon initial heating and emf-temperature performance changes resulting from preferential evaporation of one of the thermocouple elements in vacuums and extended period of use at temperatures between 2000° to 3000° C.

The thermocouple sensors of the present invention are particularly well suited to bare metal sensor applications in high-temperature, high-vacuum systems but can also be sheathed and insulated for applications in systems up to about 3000° C. Whether sheathed or unsheathed the thermocouples of the present invention provide stability and reliability by utilizing tantalum and rhenium and alloys containing only those two metals in the bimetallic thermocouple sensor to provide a reliable thermocouple having an improved operational life and reliability.

2. Description of the Prior Art

Thermocouples are useful temperature measuring devices which measure temperature by employing dissimilar metal conductors joined at a point where the temperature is to be measured with the free ends connected to an instrument which measures the amount of voltage generated at the junction of the dissimilar metal conductors. The thermocouple sensor or the bimetallic junction of the dissimilar conductors have been formed of various metals such as copper and iron which provide a thermoelectric differential between the two metals upon exposure to heat. These and other metals employed in prior art thermocouple sensors have had the disadvantage of melting at fairly low temperature, i.e., copper, 1083° C, and have required insulation and various sheathing systems to protect the thermocouple during operation at prolonged elevated temperatures and sometimes have resulted in undesirable reactions between the metals in the sensor.

The problems of undesirable reactions in thermocouple sensors have been aggravated by the temperatures encountered in nuclear reactor systems, rocketry heat sensors, high-temperature and vacuum processing and other applications where temperature measurements at or above 1500° C are involved. Thermocouples employing bimetallic sensors of tungsten and rhenium with sheathing and insulation have been utilized in an effort to prevent the disintegration of the thermocouple in such systems. The insulation and sheathing systems have had the disadvantages of resulting in time delays in obtaining temperature readings due to the insulation and mechanical failure resulting from such problems as gas leakage at the thermocouple sheath seals, cracked sheaths and other mechanical limitations imposed by ceramic insulated metal sheathed thermocouple sensors.

The tungsten, rhenium thermocouple-sensor combination and other prior art bimetallic bare sensor combinations have generally not proven to be uniformly reliable or to have a useful operational life at temperatures above 1800° C due to breakage of the thermocouple hot junction upon initial heating and drifts in emf, temperature relationships. These problems are believed to be the result of thermal and chemical phase transitions and of preferential evaporation of one of the metals in the bimetallic sensor. In particular the tungsten, rhenium thermocouple combination has not proven reliable in hightemperature and vacuum systems as a result of a high-vapor-pressure differential between rhenium and tungsten. This high-vapor-pressure differential causes thermocouples comprised of these substances to drift in their emf, temperature relationship as a result of preferential losses of rhenium by evaporation at elevated temperatures, particularly in high vacuum-systems.

SUMMARY OF THE INVENTION

The disadvantages and limitations of the prior art are obviated by the present invention which provides a reliable bimetallic thermocouple sensor for use in high-temperature and high-vacuum systems which is stable and reliable in bare sensor applications up to about 3180° C, the melting point of rhenium. Thermocouples of the present invention utilize a bimetallic thermocouple sensor wherein each of the two metals of the sensor is dissimilar and is selected from the group of metals comprising tantalum, rhenium and alloys containing these two metals. Sensors composed of tantalum, rhenium and alloys containing only these two metals provide advantages over prior art thermocouples as a result of the physical and chemical compatibility of tantalum and rhenium at high temperatures and in vacuum systems. The compatibility of tantalum and rhenium at elevated temperatures reduces the problem of preferential rhenium evaporation in the tantalum, rhenium thermocouple sensor to provide a more stable emf, temperature relationship. The vapor pressure and physical and chemical compatibility of tantalum, rhenium and alloys containing only these two metals reduce thermocouple hot-junction failures and allows such sensors to be employed in high-temperature and vacuum systems without the necessity of metallic sheaths and ceramic insulation at operating temperatures up to about 3180° C. The advantages of the present invention are further enhanced over the prior art tungsten, rhenium combinations as the maximum solubility of rhenium in tungsten is about 25% to 26% by weight while rhenium solubility in tantalum is about 49% by weight. This difference in solubilities allows tantalum, rhenium alloys that are more ductile and enables a wider selection of alloys that can be employed in the bimetallic thermocouple sensors.

The advantages of the present invention are achieved through the use of bare bimetallic thermocouple sensors utilizing either a tantalum and a tantalum alloy having about 0 to about 49% by weight rhenium dissolved therein or two dissimilar tantalum, rhenium alloys in that range or a rhenium bimetallic thermocouple sensor utilizing a rhenium alloy having about 0 to about 5% by weight tantalum dissolved therein or two dissimilar rhenium, tantalum alloys in that range. Thermocouples having a bimetallic sensor of tantalum and tantalum with about 0 to about 49% by weight rhenium dissolved therein have melting points in the range of from about 2700° C to nearly the melting point to tantalum at about 3000° C. Thermocouples having a bimetallic sensor of rhenium and rhenium with about 0 to about 5% by weight tantalum dissolved therein have melting points in the range from about 2940° C to almost the melting point of rhenium at about 3180° C.

DESCRIPTION OF THE PREFERRED EMBODIMENT

The preferred embodiment of the present invention utilizes a bimetallic thermocouple sensor wherein each metal of the sensor is dissimilar and is selected from the group of metals comprising tantalum, rhenium and alloys containing only those two metals. The chemical and physical compatibility of tantalum with rhenium and alloys thereof in high-temperature and vacuum systems allows bare metal thermocouple sensors to be used in high-vacuum, high-temperature applications which have heretofore required the use of insulated and sheathed thermocouples. Thermocouples and thermocouple sensors formed in accordance with the present invention provide advantages in reliability, increased operational life and stability at elevated temperatures and in high vacuum environments. The physical and chemical compatibility of tantalum with rhenium and the alloys thereof reduce the emf, temperature relationship drifts that result from the preferential loss of rhenium by evaporation at temperatures in the 2400° C range over periods such as 1000 hours, as will be discussed in greater detail hereinafter.

The present invention achieves its advantages in part as a result of the advantageous vapor pressure relationship between tantalum and rhenium at elevated temperatures encountered in nuclear reactors, rocket exhausts and in high temperature and vacuum systems. The vapor pressure relationship between rhenium and tantalum is almost coincidental at the temperatures of 2000° C and 3000° C. This close relationship between the vapor pressure of tantalum and rhenium over this temperature range minimizes problems resulting from the preferential loss of rhenium by evaporation. In comparison in the tungsten, rhenium thermocouple sensor of the prior art the vapor pressure of rhenium is approximately 20 times as great as that of tungsten at 2400° C in a vacuum. This vapor pressure differential in the tungsten, rhenium sensor results in preferential rhenium evaporation and in emf, temperature drifts and deterioration of the thermocouple after about 1000 hours of use. The chemical and physical compatibility of the tantalum, rhenium thermocouples of the present invention prevents the preferential loss of rhenium by evaporation to provide a thermocouple with an improved useful life and reliability.

The preferred embodiment of the present invention also includes the advantages resulting from the solubility properties of rhenium in tantalum to provide a greater selection of materials that may be employed in a bimetallic thermocouple sensor. The preferred embodiment contemplates the utilization of the solubility properties of rhenium in tantalum of about 0 to about 49% by weight for the selection of two such alloys or an alloy with pure tantalum for a thermocouple sensor. Similarly the preferred embodiment contemplates the utilization of the solubility properties of tantalum in rhenium of about 0 to about 5% by weight for the selection of two such alloys or an alloy with pure rhenium for a thermocouple sensor. The solubilities of tantalum in rhenium and rhenium in tantalum result in advantages over the prior art by providing a selection of rhenium, tantalum alloys that may be used in the bimetallic thermocouple sensor. The advantages of the preferred embodiment of the invention provide a selection of alloys for use in bare metal bimetallic thermocouple sensors for use in high temperature and vacuum systems for temperatures up to about 3180° C without emf, temperature drifts caused by preferential evaporation of rhenium.

As heretofore discussed thermocouples have found application as heat sensing devices in such fields as nuclear reactors, rocketry and high vacuum and temperature processes. In such systems thermocouples must be able to accurately measure temperatures in excess of 1500° C for thousands of hours. Under these conditions and particularly those involving vacuums and elevated temperatures most thermocouples exhibit emf, temperature drifts as a result of the preferential evaporation of one of the metals of the thermocouple sensor which results in inaccurate temperature readings.

The preferred embodiment of the present invention reduces the effects of the prior art by the utilization of tantalum and rhenium and alloys thereof as thermocouple sensors which exhibit compatible physical and chemical properties at temperatures and conditions encountered in such applications. The present bare bimetallic thermocouple sensors of tantalum, rhenium alloys are prepared by dissolving rhenium in tantalum in a range of about 0 to 49% by weight and joining two dissimilar metals in the aforementioned solubility range of the tantalum, rhenium metals. The thermocouple sensors formed from rhenium dissolved in tantalum having melting points in the range of about 2700° C to about the melting point of the tantalum at about 3000° C depending upon the percentage alloy employed. The melting point of such thermocouples is generally the solidus temperature of the lower-melting-point alloy of the bimetallic thermocouple sensor since no eutectics or melting point minima exists in the tantalum 0 to 49% by weight rhenium compositions. Similarly bimetallic thermocouple sensors of the present invention can be formed of the respective rhenium, tantalum alloys by dissolving tantalum in rhenium in a range of about 0 to about 5% by weight and joining two dissimilar metals in the aforementioned solubility range of the rhenium, tantalum metals. The thermocouple sensors formed from the tantalum dissolved in rhenium have melting points in the range of about 2940° C to about the melting point of rhenium at about 3180° C depending upon the percentage alloy employed. The melting point of such thermocouples is generally the solidus temperature of the lower-melting-point alloy of the bimetallic thermocouple sensor since no eutectics or melting point minima exists in the rhenium 0 to 5% by weight tantalum compositions. The tantalum, rhenium and rhenium, tantalum bare metal thermocouple sensors in accordance with the preferred embodiment of the present invention are obtained by selecting and joining two dissimilar metals from the group of metals comprising tantalum, rhenium and alloys containing only those two metals.

In some applications a pure-rhenium, pure-tantalum thermocouple sensor may be employed in high-temperature, high-vacuum systems. Generally, however, this combination is not preferred in high temperature applications over about 2500° C. In pure-rhenium, pure-tantalum sensors the solid-phase changes above 2200° C, probably near 2460° C and initiates melting in the junction. In high temperature applications it is therefore preferable to employ the previously described alloys of tantalum and rhenium.

The physical and chemical compatibility of rhenium, tantalum and the alloys containing only those two metals, provide a wide variety of compositions to be utilized in the formulation of a bimetallic sensor for thermocouples in accordance with the present invention. The number of useful thermocouple sensor alloys available allows a variety of thermocouple sensors to be formulated to suit a variety of high-vacuum, high-temperature systems including those employing various gaseous atmospheres. The present invention may therefore be implemented in a variety of ways by those skilled in the art to suit particular requirements and may be implemented for example through the use of various insulating and sheathing processes to suit particular requirements. It will be understood that these and various other changes and substitutions may be made within the spirit and scope of the invention as defined in the appended claims.

What is claimed is:

1. A thermocouple for measuring temperature in high temperature systems having a bimetallic thermocouple sensor wherein each metal of said bimetallic sensor is dissimilar and is selected from the group consisting of tantalum, rhenium and alloys thereof containing only rhenium and tantalum.

2. The thermocouple of claim 1 wherein said bimetallic thermocouple sensor of dissimilar metals is selected from the group of metals consisting of tantalum and tantalum alloys having about 0 to about 49% by weight of rhenium dissolved therein.

3. The thermocouple of claim 1 wherein said bimetallic thermocouple sensor of dissimilar metals is selected from the group of metals consisting of rhenium and rhenium alloys having about 0 to about 5% by weight of tantalum dissolved therein.

4. The thermocouple of claim 1 wherein said bimetallic thermocouple sensor is protected by a metal sheath.

5. The thermocouple of claim 1 wherein said bimetallic thermocouple sensor is protected by a ceramic insulator.

6. In a thermocouple for measuring temperature in high temperature and vacuum systems, the improvement comprising
a bare bimetallic thermocouple sensor of dissimilar tantalum, rhenium alloys wherein each of said bimetallic thermocouple sensor metal consists of tantalum with about 0 to about 49% by weight rhenium dissolved therein, said thermocouple sensor having a melting point in the range of about 2700° C to about 3000° C.

7. In a thermocouple for measuring temperature in high temperature and vacuum systems, the improvement comprising
a bare metallic thermocouple sensor of dissimilar rhenium, tantalum alloys wherein each of said bimetallic thermocouple sensor metals consists of rhenium with about 0 to about 5% by weight tantalum dissolved therein, said thermocouple sensor having a melting point in the range of about 2940° C to about 3180° C.

* * * * *